United States Patent [19]

Shirata et al.

[11] Patent Number: 5,078,830
[45] Date of Patent: Jan. 7, 1992

[54] METHOD FOR GROWING SINGLE CRYSTAL

[75] Inventors: Keiji Shirata; Koichi Sassa; Kenji Tomizawa; Nobuyuki Uchida; Taizo Ohmura, all of Omiya, Japan

[73] Assignee: Mitsubishi Metal Corporation, Tokyo, Japan

[21] Appl. No.: 490,931

[22] Filed: Mar. 9, 1990

[30] Foreign Application Priority Data

Apr. 10, 1989 [JP] Japan .................................. 1-90427
Jul. 3, 1989 [JP] Japan .................................. 1-171438

[51] Int. Cl.$^5$ .................................................. C30B 15/10
[52] U.S. Cl. .................................... 156/617.1; 156/607; 156/619.1; 156/620.2; 156/DIG. 70
[58] Field of Search .................... 156/607, 617.1, 619.1, 156/620.2, DIG. 70, DIG. 83

[56] References Cited

U.S. PATENT DOCUMENTS

| | | | |
|---|---|---|---|
| 3,499,736 | 3/1970 | Zwaneburg | 156/620.2 |
| 4,246,064 | 1/1981 | Dewees et al. | 156/617.1 |
| 4,264,385 | 4/1981 | Fisher | 156/607 |
| 4,431,476 | 2/1984 | Watanabe et al. | 156/607 |
| 4,597,949 | 7/1986 | Jasinski et al. | 422/249 |
| 4,668,481 | 5/1987 | Watanabe et al. | 156/DIG. 83 |

FOREIGN PATENT DOCUMENTS

| | | |
|---|---|---|
| 0140509 | 5/1985 | European Pat. Off. . |
| 2633310 | 12/1988 | Fed. Rep. of Germany ... 156/617.1 |
| 5164482 | 6/1976 | Japan . |

OTHER PUBLICATIONS

L. P. Egorov, et al., Izvestiya Akademii Nauk SSSR, vol. 40, No. 7, pp. 1542–1545, 1976.
CRC Handbook of Chemistry and Physics, "Surface Tension of Liquid Elements", Gernot Lang, F-2-5-F-42.
Patent Abstracts of Japan, vol. 10, No. 362 (C-389) [2419], 12/4/86; & JP-A-61 158 892, 7/18/86.

Primary Examiner—Olik Chaudhuri
Assistant Examiner—Felisa Garrett
Attorney, Agent, or Firm—Oblon, Spivak, McClelland, Maier & Neustadt

[57] ABSTRACT

In a single-crystal growth method disclosed herein, a melt is first prepared in a container having a cylindrical wall. The container is such that at least the inner peripheral surface of the cylindrical wall is formed of a material which is not wettable to the melt. A seed is then immersed in the melt and a single crystal rod formed on the seed is pulled in such a manner as to be coaxial with the cylindrical wall. The distance between the single crystal rod and the inner peripheral surface is set to a prescribed value G, so that the melt adjacent to the inner peripheral surface is formed into a prescribed meniscus shape. The temperature distribution at the melt surface is controlled to maintain the meniscus shape between the single crystal rod and the inner peripheral surface at an equilibrium state to thereby control the diameter of the single crystal rod.

6 Claims, 5 Drawing Sheets

METHOD FOR GROWING SINGLE CRYSTAL

BACKGROUND OF THE INVENTION

1. Field of the Invention

The present invention pertains to a single-crystal growing method suitable for semiconductor materials such as gallium arsenide or silicon and for various metals, utilizing a Czochralski process, and in particular, to an improvement in preventing the fluctuation of crystal diameter during the growing operation.

2. Prior Art

The Czochralski process comprises immersing a seed in a melt contained in a crucible and pulling it up to grow a single crystal in the form of a cylindrical rod. In this method, the configuration of a straight body portion of the single crystal must be controlled precisely in order to improve the characteristics and yield of crystals.

For the configuration control of single crystals of, for example, silicon, optical methods such as a fusion ring detection method and a light reflection method have hitherto been utilized. More specifically, the position of the periphery of the solid-liquid interface is optically detected, and feedback controls of pulling speed, heater temperature, rotational speeds of a pulling shaft and a lower shaft which holds the crucible, and so on, are carried out based on the detected position to thereby maintain the diameter of the straight body portion of the single crystal at a constant value.

However, in the manufacture of single crystals of compound semiconductor such as gallium arsenide (GaAs) or gallium phosphide (GaP), a Liquid Encapsulated Czochralski (LEC) method which involves covering the surface of the melt in the crucible with a liquid encapsulant such as $B_2O_3$ in order to prevent the dissociative component from escaping from the melt has been extensively used. In this method, the aforesaid optical methods cannot be employed because of the turbidity of the encapsulant and of flickering due to turbulent high pressure gas. Therefore, there has been developed a television image method, which uses an X-ray transmission device to observe the configuration of the solid-liquid interface. However, this method is not suitable for mass production and is dangerous due to the use of X-rays. There has been also developed a weighing method, which involves estimating the crystal diameter based on a crystal weight measured by load sensors attached to one or both of the pulling shaft and lower shaft of the growing apparatus. However, this method has the disadvantage of being inaccurate due to the sensitivity limit of the load sensor.

Accordingly, there is developed a coracle-type pulling technique as a diameter control method suitable for the LEC method, as disclosed in Japanese Patent Application Laid-Open (18-Month Publication) No. 51-64482. In this technique, a coracle which is heavier than the encapsulant but lighter than the melt is floated on the melt surface, and a single crystal is pulled through a circular opening of the coracle, so that the diameter of crystals can be controlled with high precision.

Furthermore, the aforesaid LEC method has been modified to a Liquid Encapsulated Kyropoulos (LEK) method, which is similar to the LEC method in that $B_2O_3$ is floated on the GaAs melt in the crucible. However, in this method, instead of pulling a single crystal through the $B_2O_3$ layer, the temperature of the melt in the crucible is gradually decreased to cause a single crystal to grow downward from the seed immersed in the upper portion of the melt, so that the crystal does not pass through the $B_2O_3$ layer. In this operation, the seed is pulled up only by an amount which meets the increase of volume during solidification, and hence the single crystal is prevented from contacting the crucible wall.

With this technique, the single crystal is not caused to pass through the $B_2O_3$ layer which causes a large temperature gradient, and therefore dislocations, which may be caused due to thermal stresses while passing through the $B_2O_3$ layer, are prevented from developing.

However, the aforesaid crystal growing methods have the following disadvantages.

In the method which detects the diameter of single crystals by detecting means using light, X-ray or weighing means and carries out feedback controls, the precision is limited because of the sensitivity limit of the detecting means and the difficulty in optimizing the feedback conditions. Therefore, irregularities of crystal diameter, or under some growth conditions even eccentric crystal shapes cannot be avoided as illustrated in FIG. 1, and hence a single crystal T having a completely cylindrical straight body portion cannot be manufactured.

Furthermore, in the Czochralski method, it is known that the defects of crystals can be reduced if the temperature gradient in the direction perpendicular to the solid-liquid interface is reduced during the crystal growth operation. The pulling speed must be increased to obtain a high yield. However, since the temperature gradient is kept small for an increased pulling speed, heat cannot be sufficiently dissipated from the single crystal. Hence, the problem of the poor configuration control becomes crucial.

In the coracle-type method described above, the diameter control can be achieved with high precision, but the temperature distribution in the melt fluctuates due to the motion of the floating coracle. Therefore, when growing a GaAs (100) single crystal, which has become important in recent years, twinning tends to be caused. Accordingly, this method has been applied industrially only to the manufacture of (111) single crystals. In addition, the coracle floating on the melt may cause some contamination.

There is proposed a method in which a specific member is used to prevent motion of the floating coracle. However, the apparatus is complicated in structure, so that the method cannot be suitably practiced on an industrial basis. In addition, the possibility of contamination further increases due to the use of the member.

Moreover, in the aforesaid LEK method, the growing single crystal cannot be observed since the growth occurs under the $B_2O_3$ encapsulant. As a result, it is considerably difficult to grow the crystal so as not to contact the crucible wall. If the crystal should contact the wall, twin crystals or polycrystals may be formed thereat, or the crucible may be damaged. Therefore, it is difficult to practice the method on an industrial basis.

SUMMARY OF THE INVENTION

It is therefore the object of the present invention to provide a single crystal growth method which can control the diameter of a single crystal with high precision irrespective of the kind of crystal to be manufactured.

According to the present invention, there is provided an improved method for growing a single crystal rod comprising the steps of producing a melt in a container having a cylindrical wall, immersing a seed in the melt and pulling a single crystal rod formed on the seed in such a manner as to be coaxial with the cylindrical wall, the improvement comprising forming at least an inner peripheral surface of the cylindrical wall of a material which is not wettable to the melt and setting a distance between the periphery of the single crystal rod and the inner peripheral surface of the cylindrical wall to a prescribed value G, thereby forming the meniscus shape of the melt surface between the crystal and the cylindrical wall into a prescribed meniscus shape; and controlling the temperature distribution in the melt surface to maintain the meniscus shape between the single crystal rod and the inner peripheral surface of the cylindrical wall at an equilibrium state, thereby controlling the diameter of the single crystal rod.

DETAILED DESCRIPTION OF THE INVENTION

After an extensive study on the diameter fluctuation of a single crystal rod during the pulling operation, the inventors have found that the instability of the meniscus adjacent to the solid-liquid interface may be responsible for diameter fluctuation. In view of this knowledge, the inventors have developed a novel crystal growth method as follows.

Figure 2:
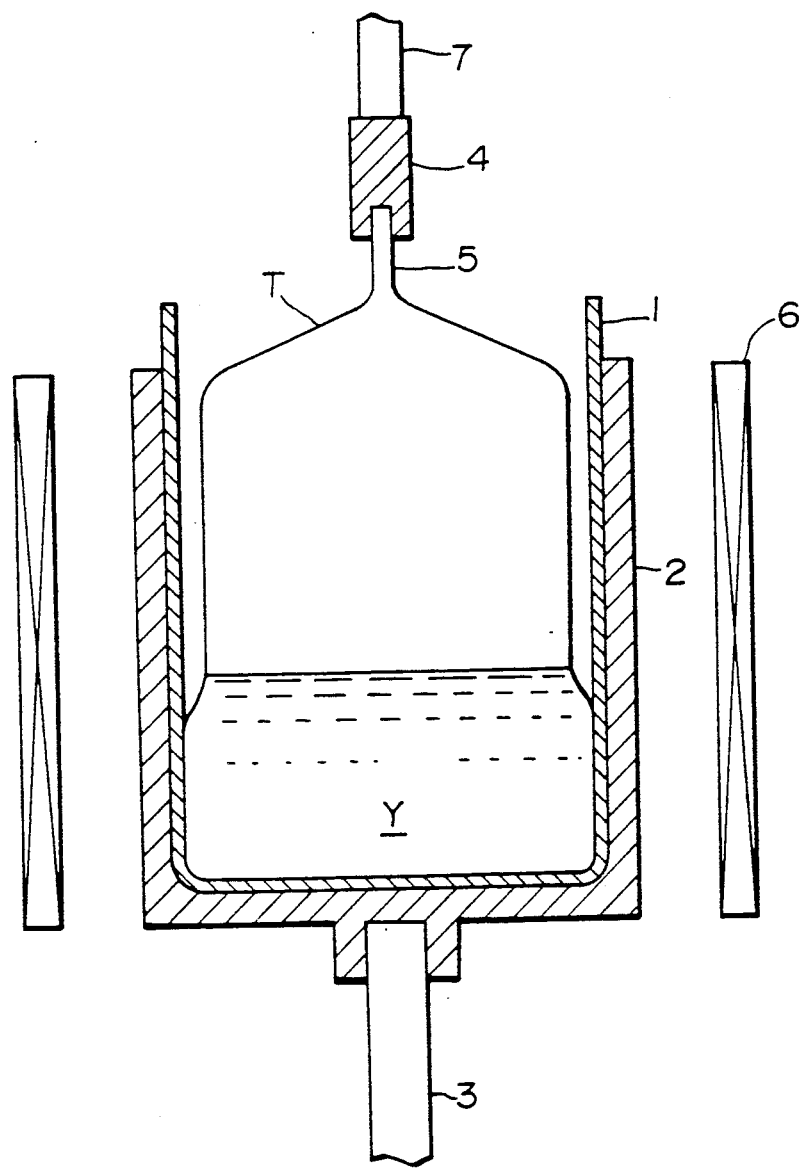
FIGS. 2 and 3 are schematic cross-sectional views for explaining a single-crystal growth method in accordance with the present invention.

FIG. 2 depicts a crystal growing apparatus which comprises a crucible 1 for holding a melt Y therein, having a cylindrical peripheral wall and which is contained in a susceptor 2, a vertically extending lower shaft 3 securely fixed to the susceptor 2, a holder 4 disposed above the crucible 1 for holding a seed 5, a heater 6 disposed around the susceptor 1 for heating the melt Y, and a pulling rod 7 for pulling up the holder 4.

In the method in accordance with the present invention, a material which is not wettable by the melt Y is used to form the crucible 1. For example, pBN or quartz may be used in the case of the manufacture of GaAs crystals, while graphite may be the most suitable for the manufacture of silicon crystals. In addition, graphite may be used for the manufacture of metallic crystals such as copper. It is not necessary to form the entire crucible 1 of the aforesaid material, but it is only required to form the inner wall surface of the cylindrical wall of the non-wettable material.

In operation, a polycrystalline material is first melted in the crucible 1 to produce the melt Y, and the seed 5 is immersed in the center of the melt Y. Then, a single crystal T formed on the seed 5 is pulled up by means of the pulling rod 7 in such a manner as to be coaxial with the crucible 1. During the pulling, temperature control is carried out by regulating the electric power applied to the heater 6 so that the temperature at the surface of the melt Y changes at a slightly positive gradient from the periphery of the single crystal T towards the cylindrical wall of the crucible 1, and that the temperature of the melt Y adjacent to the inner wall is slightly higher than the crystal growth temperature. With this temperature control, the diameter of the growing single crystal T acquires a tendency to be limited as it approaches the inner diameter of the crucible 1.

Furthermore, the growing operation is conducted so as to satisfy the following relationship $0.75 \leq G/H \leq 2$.

In the above formula, the values of G and H are determined in a manner as disclosed by L. P. Egorov, S. N. Tsivinskii and L. M. Zatulovskii, Izvestiya Akademii Nauk SSSR, Seriya Fizicheskaya, Vol. 40, No. 7, pp. 1542–1545, (1976), and they are as follows:

$$A = \{2\delta/(\rho m - \rho f)g\}^{0.5} \quad (1)$$

$$H = A\{1 + (A/4R)^2\}^{0.5} - A^2/4R \quad (2)$$

In the formula $0.75 \leq G/H \leq 2$, according to the invention,

G denotes the distance between the cylindrical wall of the crucible 1 and the outer peripheral surface of the single crystal T in cm, R denotes the radius of the single crystal T in cm, $\delta$ denotes the surface tension of the melt Y in dyn/cm, $\rho m$ denotes the density of the melt Y in g/cm³, $\rho f$ denotes the density of the ambient gas in g/cm³, g denotes the gravitational acceleration in cm/sec², A is defined by equation (1), and H is defined by equation (2).

Furthermore, when the LEC method which uses an encapsulant to cover the surface of the melt is applied, the density f of the ambient gas is replaced by the density of the encapsulant.

The values of $\delta$ or A in the above relation (1) are known for many kinds of melt materials. For GaAs melt, the value of A is known to be 4.8 mm and 3.9 mm for the cases with and without liquid encapsulant (B₂O₃), respectively (ref. (1)). For Si melt, the value of $\delta$ is known to be 720 dyn/cm (ref. (2): CRC Handbook of Chemistry and Physics, 60th edition (1979–1980), F25-42, CRC Press, Inc. Boca Raton, Fla.). Furthermore, $\delta$ values for many kinds of melt metals are known (ref. (2)).

The aforesaid relationships (1) and (2) are obtained from a known Euler-Laplace equation, and the reasons for the above restriction will be described with reference to FIG. 3.

Figure 3:
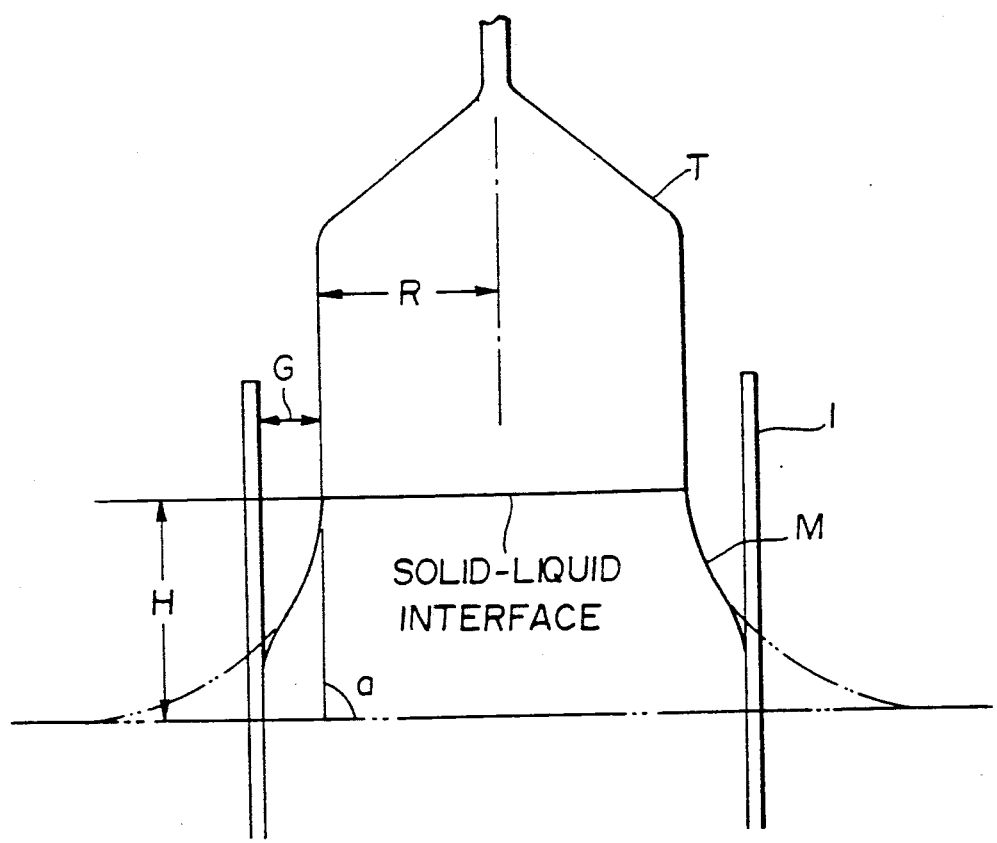

FIG. 3 is a schematic view showing the crystallization front of the single crystal T, in which H denotes a height between the solid-liquid interface and an imaginary horizontal surface of the melt, i.e., the remote surface of the melt defined in the case where there is no crucible 1. The value H is calculated based on the relationship (2) in the case where the peripheral surface of the single crystal T at the solid-liquid interface is vertical, i.e., $a = 90°$.

Figure 4:
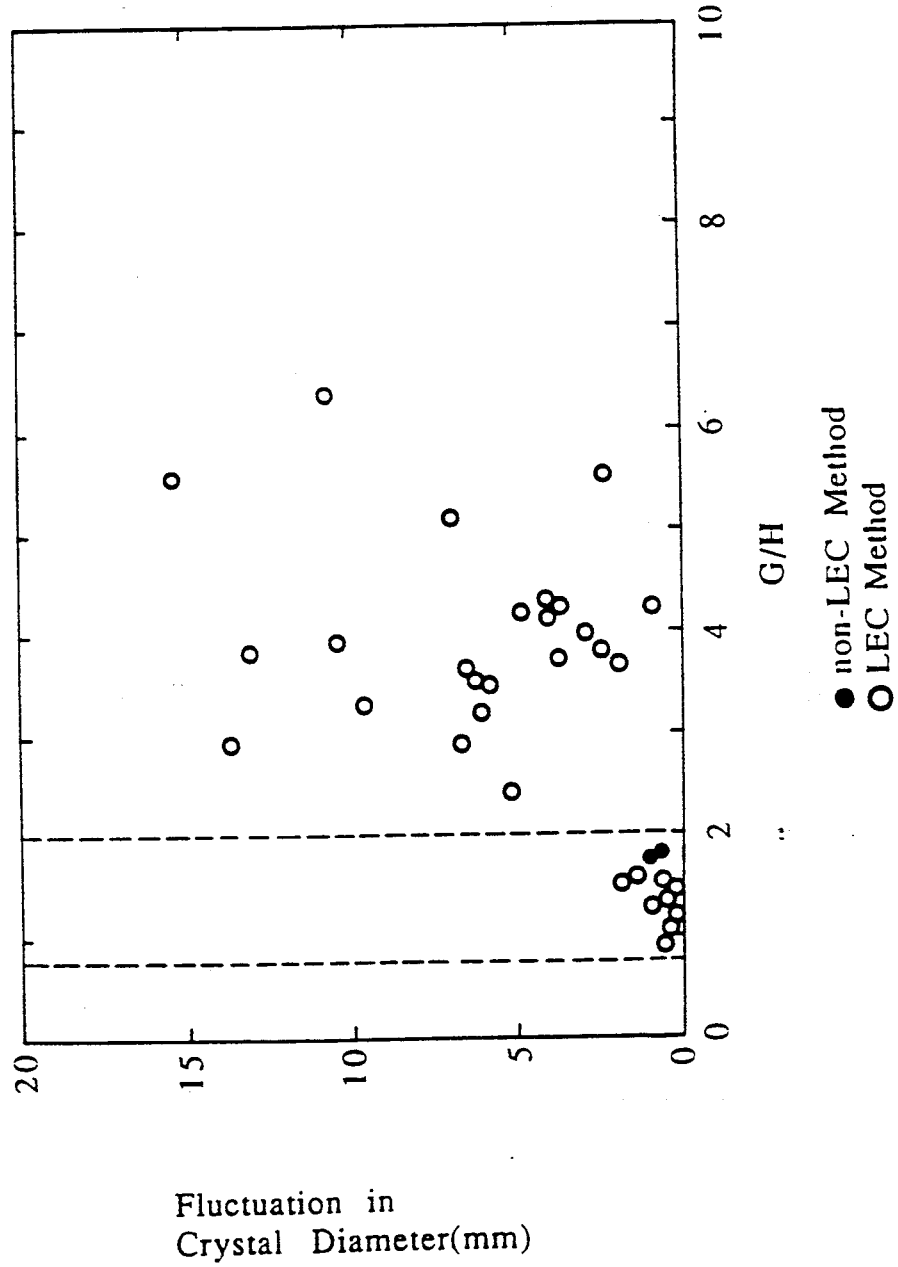
FIG. 4 is a graph showing the advantages of the method of the invention over conventional methods.

There were prepared pBN crucibles and quartz crucibles of inner diameters ranging from 15 mm to 155 mm, and many GaAs single crystals of various diameters were grown. A usual feedback diameter control process was used. FIG. 4 depicts a graph showing the correlation between the G/H and the degree of the fluctuation in crystal diameters which is the difference between a maximum diameter and a minimum one. In both of non-LEC method which does not use the encapsulant and LEC method which uses the encapsulant, the diameters of the crystals were less susceptible to fluctuation when the G/H ranged from 0.75 to 2, so that the diameters of the crystals were controlled with high precision.

The variable G/H means the degree of gap width G which is scaled by the meniscus height H, therefore, it gives a dimensionless scale of the gap width irrespective of the kind of melt.

The real meniscus shape in the melt surface between the crystal surface and the inner wall of the crucible is formed by the combination of two meniscus shapes, a meniscus of the melt surface around the liquid-solid interface an another meniscus of the melt surface adjacent to the crucible wall. Because the melt is wettable to the crystal and unwettable to the inner wall surface of the crucible, these meniscus portions continue smoothly each other with oppositely signed-curvatures. The melt surface with such a meniscus shape can cause a repulsive force between the periphery of the crucible inner wall and the periphery of the growth interface, the repulsive force which is caused by a melt surface tension.

The good configuration control which was obtained in the experiments of FIG. 4 if the variable G/H ranged from 0.75 to 2 means the aforesaid repulsive force could well balanced with the force of the melt at the meniscus around the periphery of the enlarging growth interface. The positive temperature gradient towards the crucible wall from the crystal surface can work for the good configuration control together with this meniscus mechanism, forming a natural configuration control mechanism.

Figure 1:
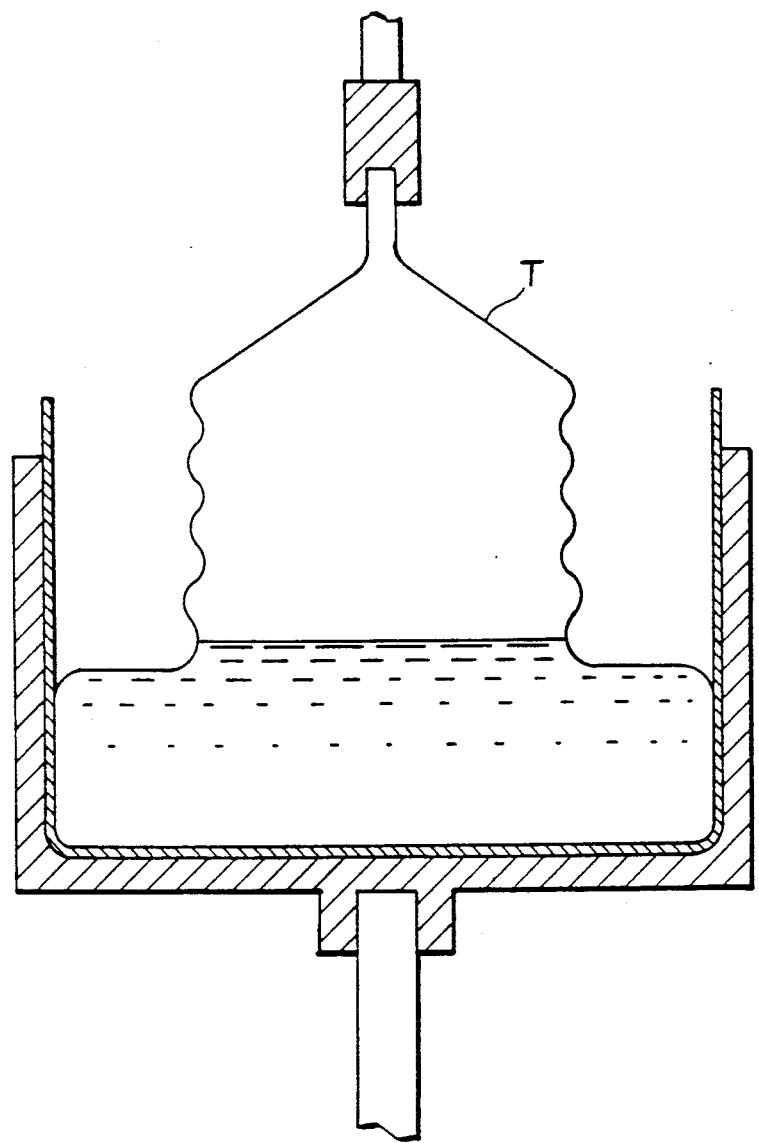
FIG. 1 is a schematic cross-sectional view for explaining conventional Czochralski methods.

In contrast, if the variable G/H was 2 or greater, the diameter control was not smooth just as illustrated in FIG. 1. It means that the repulsive force from the crucible inner wall against the crystal meniscus portion becomes insufficient with the increase of G/H variable, and hence aforesaid natural configuration control mechanism cannot work well, so that the crystal rod shows an irregular shape caused by over-shooted feedback diameter control process.

If the variable G/H is less than 0.75, the single crystal T and the crucible 1 contact each other easily due to their eccentricity or the like, thereby adversely affecting the growth of the single crystal.

In the case where GaAs single crystals are grown, it is preferable that the variable G is set so as to range from 3.5 mm to 10 mm. If the value is less than 3.5 mm, the single crystal T may contact the crucible 1. On the other hand, if the value exceeds 10 mm, the diameter of the crystal cannot be controlled as desired.

As described above, the shape of the meniscus is stabilized by balancing the force to enlarge the diameter of the single crystal and the repulsive force exerted due to the surface tension on that portion of the meniscus which attaches to the periphery of the growth front, and the fluctuation of diameter of the single crystal T is prevented and a single crystal can be successfully grown with much less irregularities and having a highly uniform cylindrical shape. In addition, inasmuch as it is not required to immerse a specific member such as a coracle in the melt, no contamination occurs.

Furthermore, even in the case where a liquid encapsulant such as $B_2O_3$ is used, the growing single crystal T can be observed in the real time, and hence it is much easier as compared with LEC method to prevent the single crystal T from contacting the crucible 1, thereby avoiding failure.

Moreover, since the diameter control becomes easier with the aforesaid technique, the temperature gradient at the solid-liquid interface can be much reduced as compared with the usual Czochralski method case. Therefore, the density of dislocations can be reduced and hence the quality of the single crystals can be improved.

Figure 5:
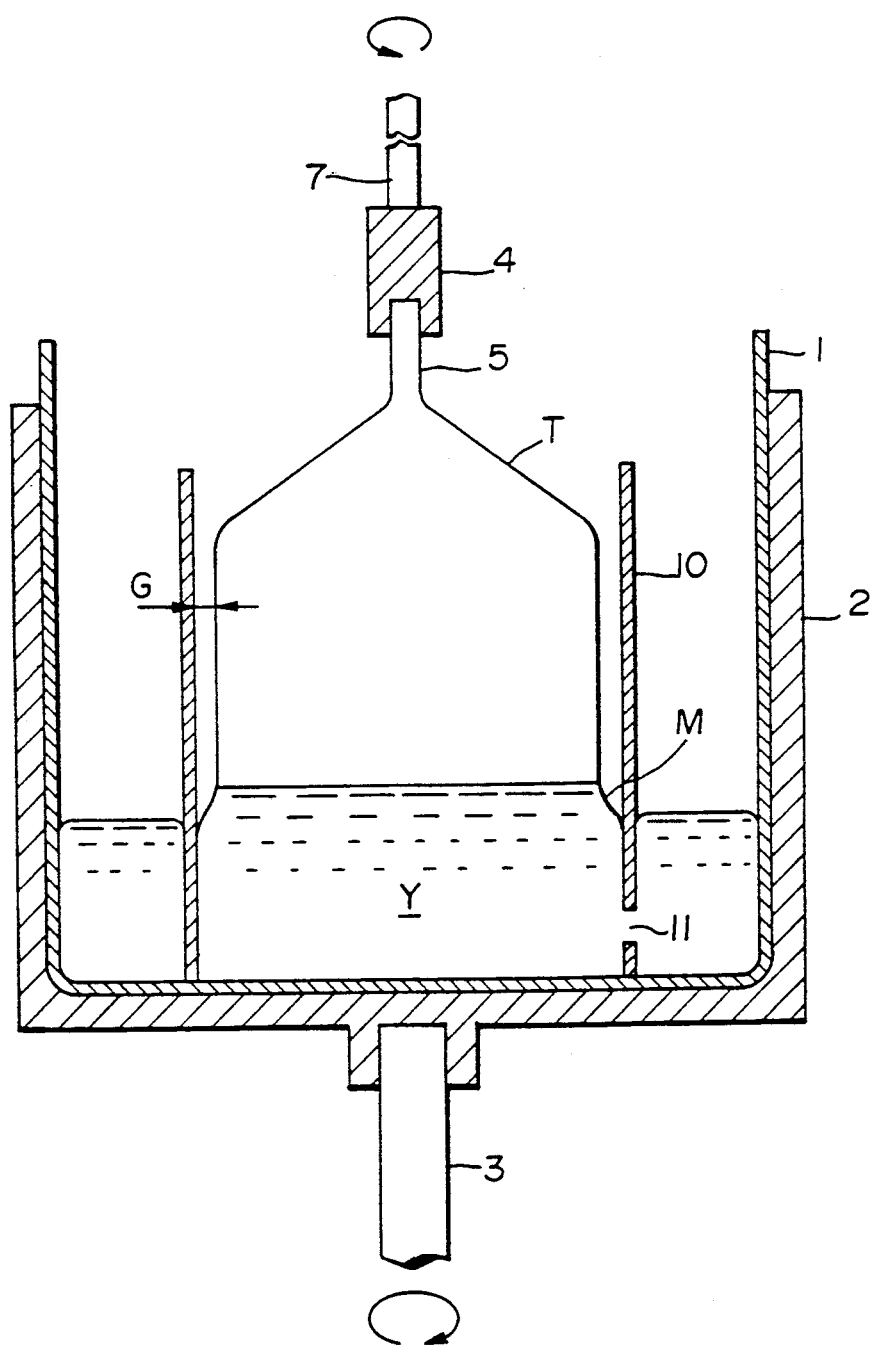
FIG. 5 is a view similar to FIGS. 2 and 3, but showing a modified method in accordance with the present invention.

The aforesaid method may be modified so that a double crucible is used, as illustrated in FIG. 5. In the drawing, the numeral 10 denotes a cylindrical partition coaxially disposed in and securely fixed to the crucible (outer crucible) 1. The partition 10 has a through aperture 11 formed at its lower end so that the inside and outside communicate. At least the inner surface of the partition 10 is made of a material which is not wettable to the melt Y. In addition, in order to use the LEC method, an encapsulant such as $B_2O_3$ may be floated on the melt surface both inside and outside with respect to the partition 10.

Even in the case where a double crucible is used, the shape of the meniscus can be stabilized by setting the aforesaid variable G/H so as to satisfy the prescribed relationships (1) to (3), and single crystals with highly uniform cylindrical shapes and less irregularities can be successfully grown.

Furthermore, in the modified method, since the capacity of the crucible can be made large in comparison to the ordinary single crucible, single crystals of a greater length can be obtained. In addition, since the material is continuously supplied into the portion between the partition 10 and the peripheral wall of the outer crucible, the growing operation can be carried out in a continuous manner, and hence single crystals of a great length can be manufactured as compared with a batch-type operation.

The present invention will now be described in more detail by way of examples.

EXAMPLE 1

A pBN crucible of an inner diameter of 85.1 mm was used, and 1,600 g of GaAs melt was produced therein in an atmosphere of As vapor pressure at 1 atm in an airtight container. Then, the crystal growing operation was carried out five times under a vertical temperature gradient at the solid-liquid interface of 8° C./cm, a rotational speed for the crystal of 5 rpm, a rotational speed for the crucible of 5 rpm, and a pulling speed of 5 mm/h.

As a result, single crystals of good quality, which had an average crystal diameter of 71.8 mm, a fluctuation in diameter of 1.0 mm, and a density of dislocation of $3 \times 10^3$ cm$^{-2}$, were obtained.

EXAMPLE 2

A pBN crucible of an inner diameter of 99.0 mm was used, and 2,600 g of GaAs melt was produced therein in an atmosphere of Ar at 5 atm. Then, the crystal growing operation was carried out three times by the LEC method under a vertical temperature gradient at the solid-liquid interface of 12° C./cm, rotational speed for the crystal or 5 rpm, a rotational speed for the crucible of 5 rpm, and a pulling speed of 5 mm/h. 300 g of $B_2O_3$ was used as an encapsulant.

As a result, single crystals of good quality, which had an average crystal diameter of 85.6 mm, a fluctuation in diameter of 1.4 mm, and a density of dislocation of $1 \times 10^4$ cm$^{-2}$, were obtained.

EXAMPLE 3

A pBN crucible of an inner diameter of 122.4 mm was used, and 5,000 g of GaAs melt was produced therein in an atmosphere of Ar at 5 atm. Then, the crystal growing operation was carried out six times by the LEC method under a vertical temperature gradient at the solid-liquid interface of 12° C./cm, a rotational speed for the crystal of 5 rpm, a rotational speed for the crucible of 5 rpm, and a pulling speed of 5 mm/h. 600 g of B$_2$O$_3$ was used as an encapsulant.

As a result, single crystals of good quality, which had an average crystal diameter of 108.8 mm, an fluctuation in diameter of 1.4 mm, and a density of dislocation of $2 \times 10^4$ cm$^{-2}$, were obtained.

EXAMPLE 4

A graphite crucible of an inner diameter of 65.0 mm was used, and 7,000 g of Cu melt was produced therein in an atmosphere of Ar at 8 torr. Then, the crystal growing operation was carried out twice under a vertical temperature gradient at the solid-liquid interface of 100° C./cm, a rotational speed for the crystal of 15 rpm, a rotational speed for the crucible of 15 rpm, and a pulling speed of 2 mm/min.

As a result, single crystals of good quality, which had an average crystal diameter of 50.2 mm and a fluctuation in diameter of 0.9 mm, were obtained.

EXAMPLE 5

A cylindrical partition of an inner diameter of 65 mm was securely fixed to a quartz crucible of an inner diameter of 122 mm to produce a double crucible, and 1,500 g of GaAs melt was produced therein in an atmosphere of Ar at 5 atm in an airtight container. Then, the crystal growing operation was carried out three times by the LEC method under a vertical temperature gradient at the solid-liquid interface of 120° C./cm, a rotational speed for the crystal of 5 rpm, a rotational speed for the crucible of 5 rpm, and a pulling speed of 5 mm/h.

As a result, single crystals of good quality, which had an average crystal diameter of 52.0 mm, a fluctuation in diameter of 0.9 mm, and a density of dislocation of $3 \times 10^3$ cm$^{-2}$, were obtained.

COMPARATIVE EXAMPLE 1

A pBN crucible of an inner diameter of 85.1 mm was used, and 1,600 g of GaAs melt was produced therein in an atmosphere of As vapor pressure at 1 atm. Then, the crystal growing operation was carried out twice under a vertical temperature gradient at the solid-liquid interface of 8° C./cm, a rotational speed for the crystal of 5 rpm, a rotational speed for the crucible of 5 rpm, and a pulling speed of 5 mm/h.

Crystals obtained had an average crystal diameter of 81.1 mm and a fluctuation in diameter of 2.2 mm, but in both of the cases the crystal contacted the crucible to form twin crystal, and no single crystal was obtained.

COMPARATIVE EXAMPLE 2

A pBN crucible of an inner diameter of 122.4 mm was used, and 3,000 g of GaAs melt was produced therein in an atmosphere of Ar at 5 atm. Then, crystal growing using the LEC method was carried out ten times by a manual control operation under a vertical temperature gradient at the solid-liquid interface of 12° C./cm, a rotational speed for the crystal of 5 rpm, a rotational speed for the crucible of 5 rpm, and a pulling speed of 5 mm/h. In the pulling, the target crystal diameter was set to 85 mm, and 600 g of B$_2$O$_3$ was employed as the encapsulant.

As a result, crystals having an average crystal diameter of 86.5 mm and a fluctuation in diameter of 7.1 mm were obtained, and the yields were bad. The density of dislocation was $3 \times 10^4$ cm$^{-2}$.

COMPARATIVE EXAMPLE 3

A pBN crucible of an inner diameter of 122.4 mm was used, and 3,000 g of GaAs melt was produced therein in an atmosphere of Ar at 5 atm. Then, the crystal growing operation using the LEC method was carried out seven times by automatic control under a vertical temperature gradient at the solid-liquid interface of 15° C./cm, a rotational speed for the crystal of 5 rpm, a rotational speed for the crucible of 5 rpm, and a pulling speed of 5 mm/h. In the operation, the target crystal diameter was set to 85 mm, and 600 g of B$_2$O$_3$ was employed as the encapsulant.

As a result, crystals having an average crystal diameter of 83.2 mm and a fluctuation in diameter of 3.9 mm were obtained, and the yields were bad. The density of dislocation was $5 \times 10^4$ cm$^{-2}$.

COMPARATIVE EXAMPLE 4

A pBN crucible of an inner diameter of 155.0 mm was used, and 5,000 g of GaAs melt was produced therein in an atmosphere of Ar at 5 atm. Then, the crystal growing operation using the LEC method was carried out twice by automatic operation under a vertical temperature gradient at the solid-liquid interface of 15° C./cm, a rotational speed for the crystal of 5 rpm, a rotational speed for the crucible of 5 rpm, and a pulling speed of 5 mm/h. In the operation, the target crystal diameter was set to 105 mm, and 600 g of B$_2$O$_3$ was employed as the encapsulant.

As a result, crystals having an average crystal diameter of 105.1 mm and a fluctuation in diameter of 5.6 mm were obtained, and the yields were bad. The density of dislocation was $5 \times 10^4$ cm$^{-2}$.

In the foregoing, the densities of dislocations for the crystals obtained in the aforesaid examples of the present invention were low compared with those obtained in the comparative examples. This is because the temperature gradient at the solid-liquid interface can be reduced as compared with the comparative examples.

The results obtained in the above-mentioned experiments are set forth in TABLE 1, in which "inner diameter" denotes the inner diameter of the crucible (the inner diameter of the partition in EXAMPLE 5), "crystal diameter" denotes the average diameter of the crystals, and "H" values are calculated by putting known δ or A values and crystal diameters in the relationships (1) and (2). "G" is calculated from the inner diameter of the used crucible and the crystal diameter.

TABLE 1

| Melt Material | Use of Liquid Encapusulant | Inner Diameter (mm) | Crystal Diameter (mm) | Fluctuation in Diameter (%) | H (mm) | G/H |
|---|---|---|---|---|---|---|
| EXAMPLE | | | | | | |
| 1 GaAs | No | 85.1 | 71.8 | 1.39 | 3.79 | 1.76 |

TABLE 1-continued

| | Melt Material | Use of Liquid Encapsulant | Inner Diameter (mm) | Crystal Diameter (mm) | Fluctuation in Diameter (%) | H (mm) | G/H |
|---|---|---|---|---|---|---|---|
| 2 | GaAs | Yes | 99.0 | 85.6 | 1.60 | 4.67 | 1.44 |
| 3 | GaAs | Yes | 122.4 | 108.8 | 1.26 | 4.69 | 1.45 |
| 4 | Cu | No | 65.0 | 50.2 | 1.85 | 5.39 | 1.37 |
| 5 | GaAs | Yes | 65.0 | 52.0 | 1.82 | 4.58 | 1.41 |
| COMPARATIVE EXAMPLE | | | | | | | |
| 1 | GaAs | No | 85.1 | 81.1 | 2.71 | 4.66 | 0.43 |
| 2 | GaAs | No | 122.4 | 86.5 | 8.15 | 4.67 | 3.84 |
| 3 | GaAs | Yes | 122.4 | 83.2 | 4.00 | 4.66 | 4.21 |
| 4 | GaAs | Yes | 155.0 | 105.1 | 5.29 | 4.69 | 5.32 |

What is claimed is:

1. In an improved method for growing a single crystal rod comprising the steps of producing a melt in a container having a cylindrical wall, immersing a seed in said melt and pulling a single crystal rod formed on said seed in such a manner as to be coaxial with said cylindrical wall, the improvement comprising forming at least an inner peripheral surface of said cylindrical wall of a material which is not wettable to said melt and setting a distance G (cm) between the periphery of the single crystal rod and the inner peripheral surface of said cylindrical wall to satisfy the following relationships:

$$0.75 \leq G/H \leq 2$$

wherein:

$$A = \{2\delta/(\rho m - \rho f)g\}^{0.5} \quad (1)$$

$$H = A\{1 + (A/4R)^2\}^{0.5} - A^2/4R \quad (2)$$

R denotes the radius of the single crystal in cm,
$\delta$ denotes the surface tension of the melt in dyn/cm,
$\rho m$ denotes the density of the melt in g/cm$^3$,
$\rho f$ denotes the density of the ambient gas in g/cm$^3$,
g denotes the gravitational acceleration in cm/sec$^2$,
G denotes the distance between the periphery of the single crystal rod and the inner peripheral surface of the cylindrical wall,
A is defined by equation (1), and
H is defined by equation (2), maintaining the meniscus shape between said single crystal rod and said inner peripheral surface at an equilibrium state, thereby controlling the diameter of the single crystal rod.

2. A method as defined in claim 1, wherein said container is comprised of a crucible having a peripheral wall defining said cylindrical wall.

3. A method as defined in claim 2, wherein said container is comprised of a double crucible having an outer crucible and a partition of a cylindrical shape disposed coaxially within and having a through aperture formed therethrough, said inner cylindrical partition defining said cylindrical wall.

4. A method as defined in claim 1, further comprising floating a liquid encapsulant on the surface of the melt.

5. A method as defined in claim 1, wherein said melt is a gallium arsenide melt, and wherein said distance G ranges from 3.5 mm to 10 mm.

6. A method as defined in claim 1, further comprising a step of controlling the surface temperature of said melt to have a slightly positive gradient from the periphery of said single crystal rod towards said inner surface of said cylindrical wall of said container.

* * * * *